United States Patent
Sutter et al.

(10) Patent No.: US 9,410,243 B2
(45) Date of Patent: Aug. 9, 2016

(54) METHOD FOR FORMING MONOLAYER GRAPHENE-BORON NITRIDE HETEROSTRUCTURES

(71) Applicant: Brookhaven Science Associates, LLC, Upton, NY (US)

(72) Inventors: Peter Werner Sutter, Westhampton Beach, NY (US); Eli Anguelova Sutter, Westhampton Beach, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 64 days.

(21) Appl. No.: 14/453,314

(22) Filed: Aug. 6, 2014

(65) Prior Publication Data

US 2015/0044367 A1 Feb. 12, 2015

Related U.S. Application Data

(60) Provisional application No. 61/862,815, filed on Aug. 6, 2013.

(51) Int. Cl.

| | |
|---|---|
| *C23C 16/34* | (2006.01) |
| *H01L 21/02* | (2006.01) |
| *C23C 16/26* | (2006.01) |
| *C30B 25/02* | (2006.01) |
| *C30B 25/18* | (2006.01) |

(Continued)

(52) U.S. Cl.
CPC ............ *C23C 16/342* (2013.01); *C01B 31/0453* (2013.01); *C01B 31/0484* (2013.01); *C01B 35/14* (2013.01); *C23C 16/26* (2013.01); *C30B 25/02* (2013.01); *C30B 25/18* (2013.01); *C30B 29/02* (2013.01); *H01L 21/0243* (2013.01); *H01L 21/0254* (2013.01); *H01L 21/0259* (2013.01); *H01L 21/0262* (2013.01); *H01L 21/02425* (2013.01); *H01L 21/02433* (2013.01); *H01L 21/02444* (2013.01); *H01L 21/02499* (2013.01); *H01L 21/02527* (2013.01)

(58) Field of Classification Search
None
See application file for complete search history.

(56) References Cited

U.S. PATENT DOCUMENTS

| | | | | |
|---|---|---|---|---|
| 2009/0140801 A1* | 6/2009 | Ozyilmaz | ............ | B82Y 10/00 327/581 |
| 2011/0089403 A1* | 4/2011 | Woo | ................. | B82Y 10/00 257/29 |

(Continued)

FOREIGN PATENT DOCUMENTS

| | | | | |
|---|---|---|---|---|
| EP | 2608267 A1 | 6/2013 | | |
| WO | WO 2011047582 A1 * | 4/2011 | ............ | B82Y 15/00 |
| WO | WO 2013/016486 A1 | 1/2013 | | |

OTHER PUBLICATIONS

Sutter Nature Apr. 2008 p. 406.*

(Continued)

*Primary Examiner* — Joseph Miller, Jr.
(74) *Attorney, Agent, or Firm* — Lars O. Husebo; Dorene M. Price

(57) ABSTRACT

A method for fabricating monolayer graphene-boron nitride heterostructures in a single atomically thin membrane that limits intermixing at boundaries between graphene and h-BN, so as to achieve atomically sharp interfaces between these materials. In one embodiment, the method comprises exposing a ruthenium substrate to ethylene, exposing the ruthenium substrate to oxygen after exposure to ethylene and exposing the ruthenium substrate to borazine after exposure to oxygen.

19 Claims, 12 Drawing Sheets

(51) Int. Cl.
*C30B 29/02* (2006.01)
*C01B 31/04* (2006.01)
*C01B 35/14* (2006.01)

(56) References Cited

U.S. PATENT DOCUMENTS

| | | | |
|---|---|---|---|
| 2011/0163298 A1 | 7/2011 | Sung | |
| 2011/0223444 A1 | 9/2011 | Brown et al. | |
| 2011/0233513 A1 | 9/2011 | Dimitrakopoulos et al. | |
| 2011/0256386 A1* | 10/2011 | Shi | C23C 16/342 428/336 |
| 2012/0037919 A1* | 2/2012 | Xu | B82Y 15/00 257/76 |

OTHER PUBLICATIONS

Liu NanoLetters 2011 V11 p. 2032-2037.*
Ci, L., et al., "Atomic layers of hybridized boron nitride and graphene domains," *Nature Materials*, vol. 9, pp. 430-435, (2010).
Sutter, P., et al., "Chemical Vapor Deposition and Etching of High-Quality Monolayer Hexagonal Boron Nitride Films," *ACS Nano*, vol. 5, No. 9, pp. 7303 to 7309, (2011).
Zhao, L., et al., "Visualizing Individual Nitrogen Dopants in Monolayer Graphene," *Science*, vol. 333, pp. 999 to 1003, (2011).
Krivanek, O., et al., "Atom-by-atom structural and chemical analysis by annular dark-field electron microscopy," *Nature*, vol. 464, pp. 571-574, (2010).
Loginova, E., et al., "Evidence for graphene growth by C cluster attachment," *New Journal of Physics*, vol. 10, No. 093026, pp. 1-16, (2008), [online], [retrieved Jul. 25, 2014] from the internet: <URL: http://iopscience.iop.org/1367-2630/10/9/093026 >.
Sutter, P., et al., "Epitaxial graphene on ruthenium," *Nature Materials*, vol. 7, pp. 406-411, (2008).
Sutter, P., et al., "Real-Time Microscopy of Graphene Growth on Epitaxial Metal Films: Role of Template Thickness and Strain," *Small*, vol. 8, No. 14, pp. 2250 to 2257, (2012).
Sutter, P., et al., "Graphene growth on epitaxial Ru thin films on sapphire," *Applied Physics Letters*, vol. 97, pp. 213101-1 to 213101-3, (2010).

Fiori, G., et al., "Lateral Graphene-hBCN Heterostructures as a Platform for Fully Two-Dimensional Transistors," *ACS Nano*, vol. 6, No. 3, pp. 2642 to 2648, (2012).
Lee, K., et al., "Large-Scale Synthesis of High-Quality Hexagonal Boron Nitride Nanosheets for Large-Area Graphene Electronics," *Nano Letters*, vol. 12, pp. 714-718, and 5 pages of supporting information, (2012), [online] [retrieved Jul. 25, 2014] from the internet: <URL:http://bv9ps6ce6t.scholar.serialssolutions.com/?sid=google&auinit=KH&aulast=Lee&atitle=Large-scale+synthesis+of+high-quality+hexagonal+boron+nitride+nanosheets+for+large-area+graphene+electronics&id=doi:10.1021/nl203635v&title=Nano+letters&volume=12&issue=2&date=2012&spage=714&issn=1530-6984>.
Levendorf, M., et al., "Graphene and boron nitride lateral heterostructures for atomically thin circuitry," *Nature*, vol. 488, pp. 627-632, (2012).
Liu, Z., et al., "Direct Growth of Graphene/Hexagonal Boron Nitride Stacked Layers," *Nano Letters*, vol. 11, pp. 2032 to 2037, (2011).
Oshima, C., et al., "Ultra-thin epitaxial films of graphite and hexagonal boron nitride on solid surfaces," *Journal of Physics: Condensed Matter*, vol. 9, pp. 1-20, (1997).
Pruneda, J., et al., "Origin of half-semimetallicity induced at interfaces of C-BN heterostructures," *Physical Review B*, vol. 81, pp. 161409-1 to 161409-4, (2010), [online], [retrieved Jul. 25, 2014] from the internet: <URL:http://journals.aps.org/prb/pdf/10.1103/PhysRevB.81.161409>.
Sutter, P., et al., "Interface Formation in Monolayer Graphene-Boron Nitride Heterostructures," *Nano Letters*, vol. 12, pp. 4869 to 4874, and 4 pages of Supplementary Online Material, (2012), [online], [retrieved Jul. 25, 2014] from the internet: <URL: http://pubs.acs.org/doi/abs/10.1021/nl302398m>.
Sutter, P., et al., "Scalable Synthesis of uniform Few-Layer Hexagonal Boron Nitride Dielectric Films," *Nano Letters*, vol. 13, pp. 276-281, and 6 pages of Supplementary Online Material, (2013), [online], [retrieved Jul. 25, 2014] from the internet: <URL:http://pubs.acs.org/doi/abs/10.1021/nl304080y>.
Sutter, P., et al., "Microscopy of Graphene Growth, Processing and Properties," *Advanced Functional Materials*, vol. 23, pp. 2617 to 2634, (2013).

* cited by examiner

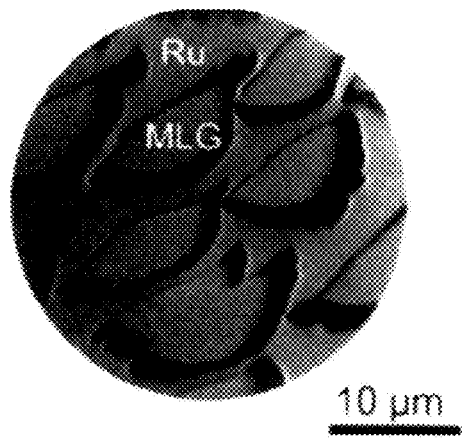 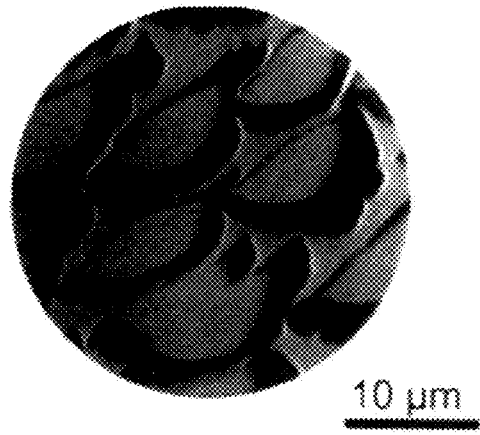
FIG. 1(a)  FIG. 1(b)
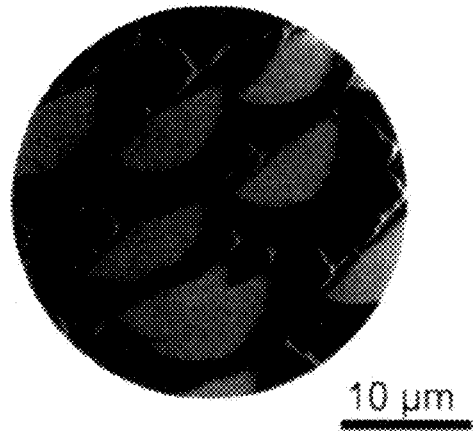 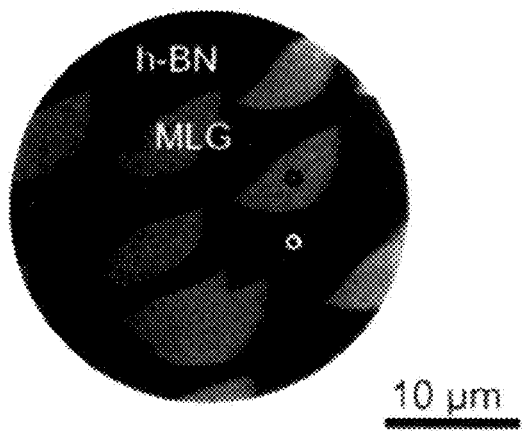
FIG. 1(c)  FIG. 1(d)
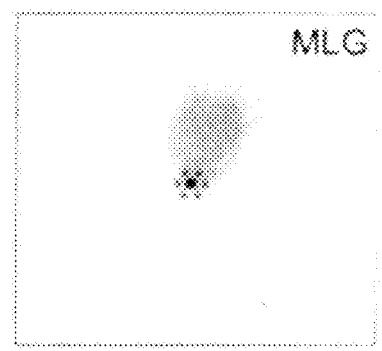 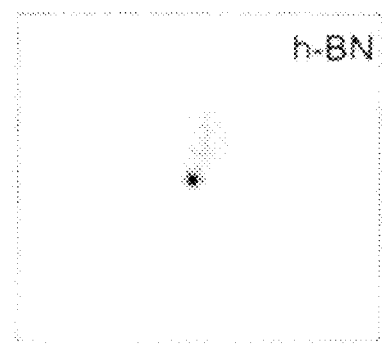
FIG. 1(e)  FIG. 1(f)

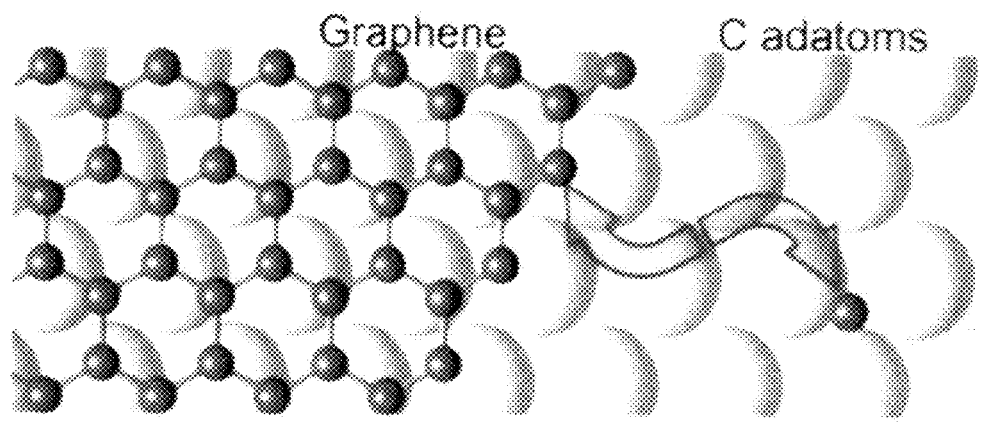
FIG. 5(a)
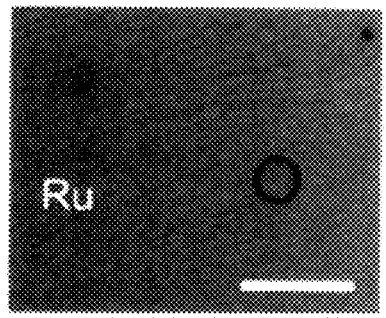
FIG. 5(b)
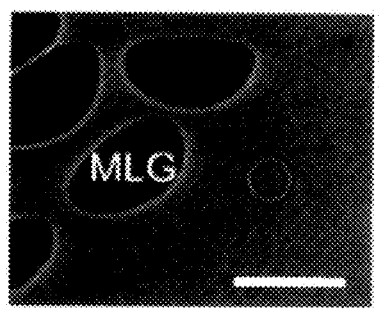
FIG. 5(c)
FIG. 5(d)
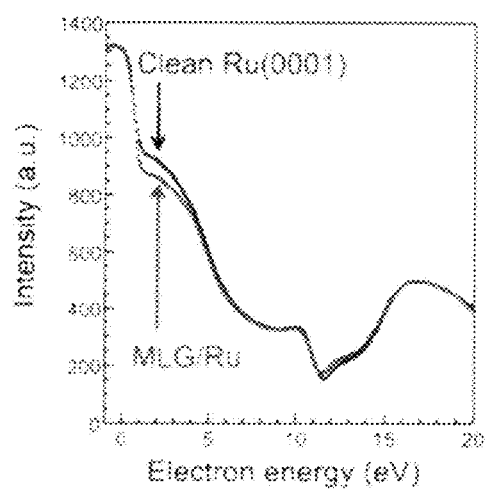

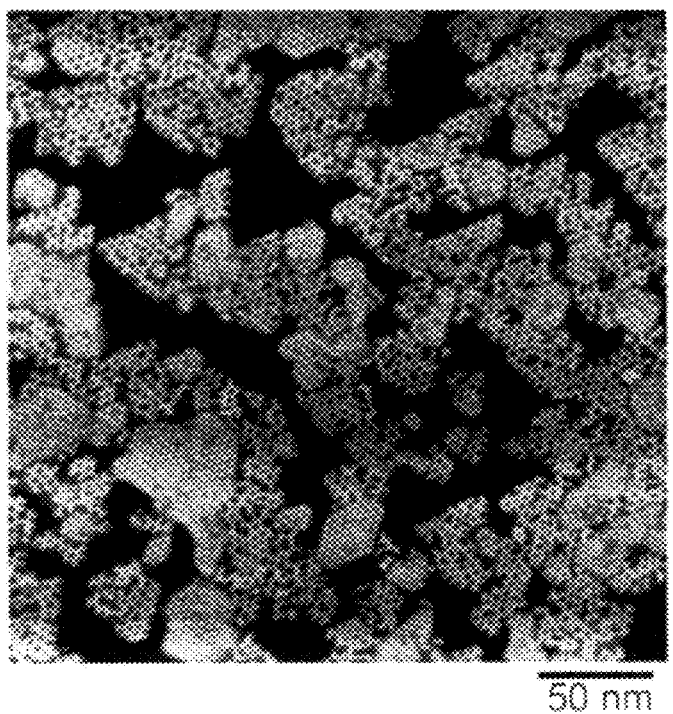
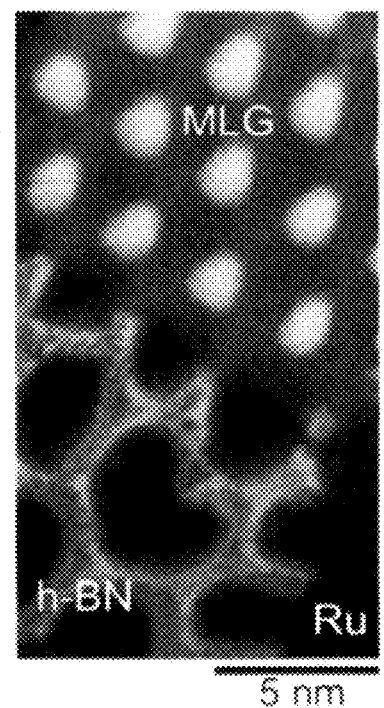
FIG. 10(a)  FIG. 10(b)
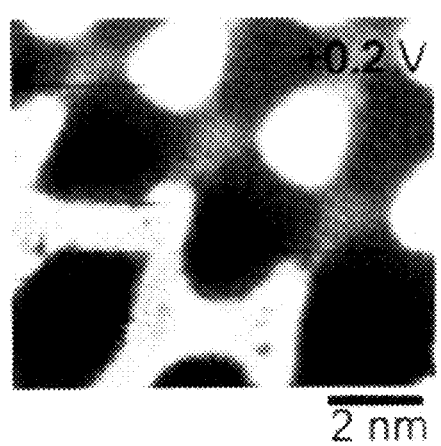
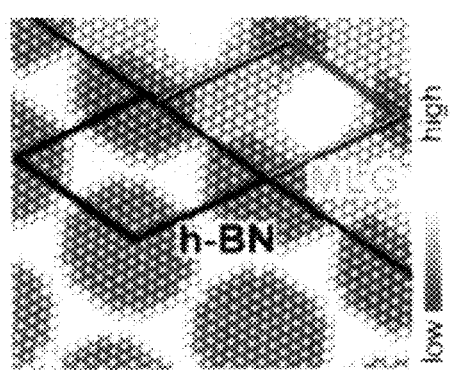
FIG. 10(c)  FIG. 10(d)

METHOD FOR FORMING MONOLAYER GRAPHENE-BORON NITRIDE HETEROSTRUCTURES

CROSS-REFERENCE TO A RELATED APPLICATION

This application claims the benefit of U.S. Provisional Patent Application Ser. No. 61/862,815 filed Aug. 6, 2013, which is incorporated herein by reference in its entirety.

This invention was made with Government support under Contract No. DE-AC02-98CH10886, awarded by the U.S. Department of Energy. The United States government has certain rights in the invention.

FIELD OF THE INVENTION

The methods disclosed and taught herein generally relate to the formation of monolayer heterostructures, and in particular, methods for formation of monolayer graphene-boron nitride heterostructures that limit intermixing at boundaries between graphene and hexagonal boron nitride (h-BN), so as to achieve atomically sharp interfaces between these materials.

BACKGROUND

Monolayer materials, such as graphene and hexagonal boron nitride (h-BN), are materials with great potential for electronics and other future device architectures based on atomically thin (monolayer) sheets. Graphene is a single atomic layer of $sp^2$-bonded carbon (C) atoms densely packed into the form of a two-dimensional honeycomb crystal lattice. Graphene has been shown to be a zero-bandgap material whose charge carriers behave as massless Dirac fermions. It has remarkably high room-temperature charge carrier mobility with individual carriers exhibiting long-range ballistic transport. In the form of a monolayer sheet, h-BN is a single atomic layer of alternating boron and nitrogen atoms. In the bulk, h-BN has a graphite-like structure, in which such planar BN sheets are stacked on top of each other in a regular fashion. The large band gap of h-BN (both in the bulk and as a monolayer sheet) make this material capable of emitting deep ultraviolet radiation, which can be particularly beneficial for incorporation into a variety of optoelectronic devices, especially used for, as an example, nanometer lithography and white light in LED's.

Monolayers of graphene and h-BN are an attractive pair of materials that can be integrated to form 2D hetero structures in individual monolayer membranes. They are isostructural, nearly lattice-matched, and isoelectronic. As will be shown below, h-BN attaches preferentially to existing graphene domains and does not produce any secondary nuclei during growth at high temperature, which is consistent with the preferential incorporation of boron and nitrogen at the graphene edge.

The different band structures between graphene and h-BN generate a potential for interesting functional properties arising from the integration of the two materials in a heterogeneous monolayer membrane. Some of the unusual electronic properties that have been predicted in connection with the interfaces between monolayer graphene and h-BN include the opening of a variable bandgap, magnetism, unique thermal transport properties, robust half-metallic behavior without applied electric fields, and interfacial electronic reconstructions analogous to those observed in oxide heterostructures. Some of these unusual properties result because monolayer graphene boron nitride heterostructures have the potential to overcome the limitations due to the vanishing energy-gap of graphene.

Despite the extraordinary potential associated with interfaces between monolayer graphene and h-BN, access to these properties depends on methods for adequately controlling the formation of the interfaces between the monolayer graphene and h-BN domains within a single atomic layer. Harnessing these properties in large scale practical applications requires the identification of growth protocols and processing conditions tailored to their unique physical and chemical properties. Beyond the synthesis of the individual constituents (graphene, h-BN) as monolayer membranes, the synthesis of heterostructured 2D membranes with well-defined interfaces presents unique challenges, and raises fundamental questions on materials integration, such as interface formation and reduction of intermixing along boundary interfaces.

Techniques for the synthesis of two-dimensional (2D) materials and their heterostructures on metal substrates have become increasingly well developed. For instance, one investigation indicated that few-layer hybrids on Cu provide evidence for separate graphene and boron nitride domains on the nanoscale. (See Ci, L.; Song, L.; Jin, C.; Jariwala, D.; Wu, D.; Li, Y.; Srivastava, A.; Wang, Z. F.; Storr, K.; Balicas, L.; Liu, F.; Ajayan, P. M. *Nat Mater* 2010, 9, (5), 430-435, incorporated by reference in its entirety.) However, this investigation did not address interface formation between graphene and boron-nitride domains. Nor did it offer any insight into the ways that a metal substrate can cause modifications to the phase behavior of graphene and boron nitride domains.

Many of the unique properties predicted for monolayer graphene/h-BN heterostructures depend on the ability to fabricate such heterostructures with atomically sharp boundaries between the two constituents, that is graphene being bonded directly to h-BN without an intermixed ternary C—B—N "alloy" phase in between. However, in principle, several mechanisms could lead to mixing or alloying between graphene and h-BN. For example, substitution of carbon by boron or nitrogen at the graphene edge, direct substitution of carbon for boron or nitrogen (or vice versa) inside an existing domain, or carbon incorporation during the growth h-BN domains could result in substantial intermixing along the monolayer graphene/h-BN interfaces within monolayer graphene boron nitride heterostructures. All of these effects would lead to non-abrupt boundaries, in which the pure phases (graphene, h-BN) are separated by an intermixed zone containing C, B, and N instead of the desired atomically sharp boundary. Such non-abrupt, non-atomically sharp interfaces between monolayer graphene and h-BN hinder exploitation of the extraordinary potential associated with these interfaces in monolayer graphene boron nitride hetero structures. Consequently, identifying the extent of intermixing and controlling the formation of monolayer graphene/h-BN interfaces that limits a possible intermixing so as to achieve atomically sharp interfaces remains a challenge and has not heretofore been known or understood.

SUMMARY OF THE INVENTION

In view of the above-described problems, needs and goals, a method according to some embodiments of the disclosed invention will be described in detail. This method relates to fabricating monolayer graphene-boron nitride heterostructures in a single atomically thin membrane that limits or otherwise is used to regulate the degree of intermixing at boundaries between graphene and h-BN, so as to for example, in the case where the intermixing is limited achieve atomically sharp interfaces between these materials. In one embodiment, a method is disclosed for forming a graphene boron nitride heterostructure. The method comprises exposing a ruthenium substrate to ethylene, exposing the ruthenium substrate to oxygen after exposure to ethylene and exposing the ruthenium substrate to borazine after exposure to oxygen. In an alternate embodiment, the method further comprises stopping exposure to ethylene upon partial coverage of the ruthenium substrate with graphene. In an alternate embodiment, the method further comprises stopping exposure to ethylene exposure after a certain amount of time such as for example, approximately 400 seconds at $10^{-8}$ Torr pressure and 800° C. temperature. In an alternate embodiment, the method further comprises stopping exposure to oxygen when C adatoms have been substantially eliminated from portions of the ruthenium substrate that are not covered by graphene. In an alternate embodiment, the exposures to ethylene, oxygen and borazine are performed via ultrahigh vacuum chemical vapor deposition (CVD). In an alternate embodiment, the ruthenium substrate comprises a Ru(0001) single Crystal substrate. In an alternate embodiment, the ruthenium substrate comprises a polycrystalline Ru thin film on a silicon-dioxide/silicon substrate. In an alternate embodiment, the ruthenium substrate comprises an epitaxial Ru(0001) thin film on a sapphire substrate. In an alternate embodiment, the exposure to ethylene occurs at a pressure of $1\times10^{-8}$ Torr. In an alternate embodiment, the exposure to ethylene occurs at a temperature between 740° C. to 800° C. In an alternate embodiment, the exposure to oxygen occurs at a pressure of $2\times10^{-9}$ Torr. In an alternate embodiment, the exposure to oxygen occurs at a temperature between 610° C. to 680° C. In an alternate embodiment, the exposure to borazine occurs at a pressure of $1\times10^{-7}$ Torr. In an alternate embodiment, the exposure to borazine occurs at a temperature of 680° C. In an alternate embodiment, the ethylene is 99.999 percent pure. In an alternate embodiment, the borazine is 99.999 percent pure. In an alternate embodiment, the oxygen is 99.999 percent pure $O_2$.

These and other characteristics of the disclosed embodiments will become more apparent from the following description and illustrative embodiments which are described in detail with reference to the accompanying drawings.

BRIEF DESCRIPTION OF THE DRAWINGS

FIG. 1 (a) shows real-time low-energy electron microscopy (LEEM) images of the synthesis of monolayer graphene-boron nitride heterostructures formed on a Ru(0001) substrate over 250 seconds.

FIG. 1 (b) shows real-time low-energy electron microscopy (LEEM) images of the synthesis of monolayer graphene-boron nitride heterostructures formed on a Ru(0001) substrate over 400 seconds.

FIG. 1 (c) shows real-time low-energy electron microscopy (LEEM) images of the synthesis of monolayer graphene-boron nitride heterostructures formed on a Ru(0001) substrate over 550 seconds.

FIG. 1 (d) shows real-time low-energy electron microscopy (LEEM) images of the synthesis of monolayer graphene-boron nitride heterostructures formed on a Ru(0001) substrate over 670 seconds.

FIG. 1(e) shows micro low-energy electron diffraction (LEED) patterns showing the micro-diffraction pattern of monolayer graphene after growth on Ru(0001) substrate.

FIG. 1(f) shows micro low-energy electron diffraction (LEED) patterns showing the micro-diffraction pattern of hexagonal boron-nitride surrounding the monolayer graphene grown on the Ru(0001) substrate.

FIG. 5(a) shows a ball and stick model for monolayer graphene on Ru(0001) substrate, including population of C adatoms on the Ru(0001) surface.

FIG. 5(b) shows a LEEM image of the Ru(0001) substrate.

FIG. 5(c) shows a LEEM image of monolayer graphene on Ru(0001) substrate.

FIG. 5(d) shows a comparison of LEEM I-V spectra at 700° C. of clean Ru(0001) substrate and Ru(0001) substrate surface adjacent to monolayer graphene domains.

FIG. 10(a) shows an UHV STM image of monolayer graphene-boron nitride heterostructures.

FIG. 10(b) shows an UHV STM image of monolayer graphene-boron nitride heterostructures.

FIG. 10(c) shows an UHV STM image of monolayer graphene-boron nitride hetero structures.

FIG. 10(d) shows an UHV STM image of monolayer graphene-boron nitride hetero structures.

DETAILED DESCRIPTION

Figure 2A:
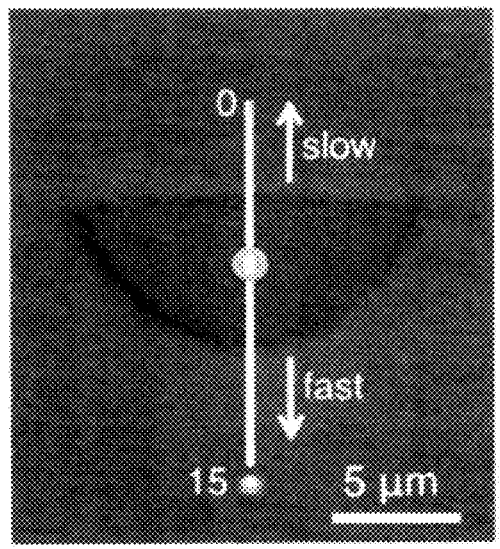
FIG. 2(a) shows ultrahigh vacuum (UHV) scanning-electron microscope (SEM) image of a monolayer graphene-boron nitride hetero structure grown by sequential CVD at 800° C.

Reference will be made in detail to embodiments, examples of which are illustrated in the accompanying drawings. The disclosed embodiments may have different forms and should not be construed as being limited to the descriptions set forth herein. Accordingly, the embodiments are merely described below, by referring to the figures, to explain aspects of the present description.

The present discovery is based on the formation of synthesized monolayer graphene boron nitride heterostructures on a ruthenium surface, during which elimination of C adatoms on the ruthenium surface can limit or be otherwise used to regulate the degree of intermixing at the interfacial region between monolayer graphene and h-BN (hexagonal boron nitride, and as used herein interchangeably simply boron nitride) domains. The discovery also stipulates that 2D membranes comprising mixed ternary (alloy) phases with arbitrary C—B—N composition (between the two endpoints, BN and graphene, i.e., pure C) can be achieved on metal substrates (e.g., Ru) by sequential or simultaneous chemical vapor deposition using C and B/N containing precursors, such as ethylene and borazine. In particular, controlled exposure of the ruthenium surface to $O_2$ after partial graphene growth can sufficiently eliminate C adatom, which in turn reduces C incorporation into subsequently grown h-BN domains. The result in this case can be a monolayer graphene boron nitride heterostructure with atomically-sharp, abrupt interfaces between the monolayer graphene and h-BN domains. Additionally, the degree or amount of intermixing can be identified and used to control the formation of a desired monolayer graphene/h-BN interface having an intermixed non-abrupt boundary between graphene and h-BN, or even a uniform monolayer with mixed C—B—N composition.

Monolayer graphene boron nitride heterostructures—without atomically sharp interfaces between graphene and h-BN domains—can be formed on a Ru substrate via ethylene exposure, followed borazine exposure. For instance, referring to FIGS. 1(a)-(d), monolayer graphene domains were formed by exposing a Ru(0001) substrate to high-purity ethylene pursuant to UHV chemical vapor deposition. Upon partial coverage of the Ru(0001) substrate with monolayer graphene domains, the ethylene exposure was stopped, and the sample was exposed to borazine to initiate hexagonal boron nitride growth.

FIGS. 1(a)-(d) show real-time low-energy electron microscopy (LEEM) images of the synthesis of monolayer graphene-boron nitride heterostructures formed on the Ru(0001) substrate. In FIG. 1(a), monolayer graphene and h-BN domains are distinguished by their different LEEM image contrast. The monolayer graphene domains can be observed due to their characteristic lens shape, which is determined by differences in the graphene growth rate in relation to the direction of surface steps on the Ru(0001) substrate. Due to the stepped-nature of the Ru surface, growth of graphene domains tends toward a carpet-like expansion of the graphene sheet in the direction of the "downhill" steps, while graphene domains resist expansion in the "uphill" direction. FIG. 1(a) shows an elapsed time period of 250 seconds, and low h-BN coverage. At this stage, all h-BN attaches to the edges of existing monolayer graphene domains, and no nucleation of h-BN on the Ru(0001) surface is observed far away from the monolayer graphene domains. FIG. 1(b) shows an elapsed time period of 400 seconds, and FIG. 1(c) shows and elapsed time period of 550 seconds. During these periods (FIGS. 1(b) and (c)), the sample is subjected to longer borazine exposure, which leads to progressively larger h-BN growth on the Ru(0001) substrate. The h-BN expands anisotropically, (which is similar to the growth of monolayer graphene on the Ru(0001) substrate,) with high growth rate along the substrate's terraces and in the "downhill" direction across the substrate steps, but with lower growth rate in the "uphill" direction. FIG. 1(d) shows an elapsed time period of 670 seconds. By this stage, the Ru(0001) substrate is covered by a continuous layer comprising graphene domains embedded in h-BN. The observations depicted in FIGS. 1(a)-(d) are consistent with large (several μm) diffusion lengths of the mobile N- and B-containing surface species, along with sufficiently low barriers allowing their preferential incorporation into the graphene edges and avoiding h-BN nucleation on the free Ru surface. Overall, the mesoscale growth characteristics suggest bonding of the graphene and boron nitride lattices at the atomic scale, but this is not confirmed by scanning tunneling microscopy (STM).

The formation of a monolayer heterostructure of graphene domains surrounded by h-BN is corroborated, again on the mesoscale, by micro-LEED depicted in FIGS. 1(e) and (f). FIG. 1(e) shows the micro-diffraction pattern of monolayer graphene (μm aperture, centered on black circle in FIG. 1(d)). The graphene has the characteristic moiré structure of monolayer graphene grown on Ru(0001), with a coincidence lattice of approximately 12×12 [G] on 11×11 [Ru] unit cells (period ~29.8 Angstroms.) FIG. 1(f) shows a micro-diffraction pattern for h-BN (centered on white circle in FIG. 1(d)). Far from the interface, the surrounding h-BN shows a uniform diffraction pattern consistent with a moiré structure of 13×13 [BN] on 12×12 [Ru] (period ~32.5 Angstroms.) Both the graphene and h-BN lattices are aligned in-plane with the Ru(0001) surface mesh, which indicates that they are closely aligned relative to one another.

Nevertheless, despite formation of distinct monolayer graphene and h-BN domains as depicted in FIG. 1, the interfacial regions between the graphene and h-BN domains do not have atomically sharp boundaries. Instead, observations indicate that at the graphene/h-BN interface, a mixed phase containing B, N, as well as C exists. Chemical analysis by ultrahigh-vacuum (UHV) nano-Auger electron spectroscopy (AES) was used to probe a possible intermixing in graphene-boron nitride heterostructures near the graphene/h-BN interfacial region. Non-abrupt graphene and h-BN interfaces for synthesized monolayer graphene boron nitride heterostructures were observed in connection with FIG. 2.

Figure 2B:
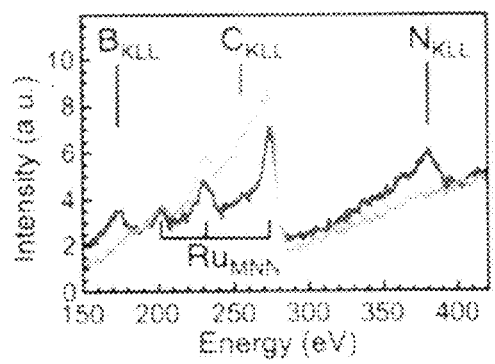
FIG. 2(b) shows Auger electron spectra at points within the monolayer graphene and hexagonal boron nitride domains of a monolayer graphene-boron nitride heterostructure grown by sequential CVD at 800° C.

Referring to FIG. 2, pure monolayer graphene and h-BN domains were observed far from the graphene/h-BN interface. This is shown in FIG. 2(a), which shows UHV scanning-electron microscope (SEM) image of a monolayer graphene-boron nitride heterostructure grown by sequential chemical vapor deposition at 800° C. The arrows in FIG. 2(a) designate the fast ("downhill") and slow ("uphill") growth directions of both monolayer graphene and h-BN. FIG. 2(b) shows Auger electron spectra points near the center of the monolayer graphene domain and in the h-BN domain. (Both points are marked in FIG. 2(a)). As illustrated, only carbon is detected within the monolayer graphene domain, which implies that exposure of the monolayer graphene on the Ru substrate to borazine does not cause significant B or N incorporation into the graphene. This is consistent with a low reactivity of supported monolayer graphene, which is similar to that of h-BN/Ru (See Sutter, P.; Lahiri, J.; Albrecht, P.; Sutter, E. *ACS Nano* 2011, 5, (9), 7303-7309, incorporated herein by reference in its entirety.) and which suppresses borazine dissociation on graphene and substitution of boron or nitrogen for carbon in the graphene lattice. Thus, FIGS. 2(a) and (b) demonstrate that far from the interface between the graphene and h-BN domains, there exists pure monolayer graphene and h-BN.

Figure 2C:
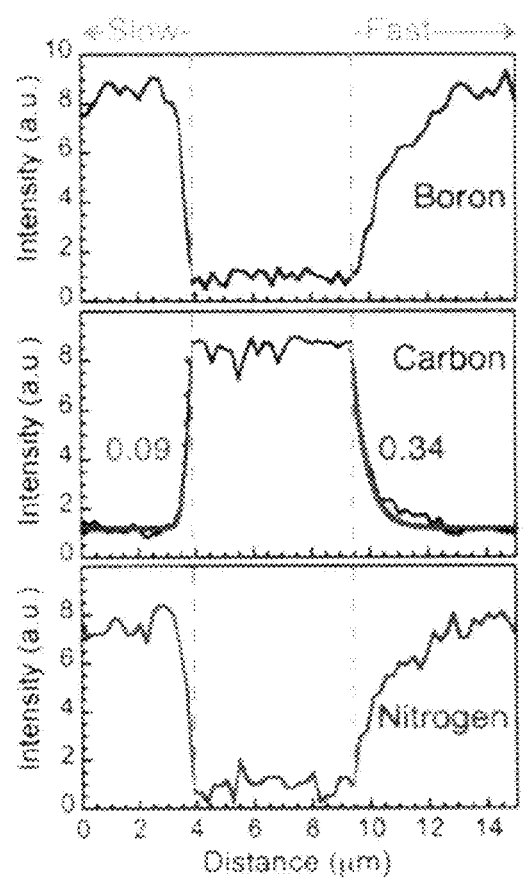
FIG. 2(c) shows UHV nano-Auger electron spectroscopy (AES) line scans measuring the local abundance of boron, carbon and nitrogen of a monolayer graphene-boron nitride heterostructure grown by sequential CVD at 800° C.

By contrast, AES line scans directed closer to the monolayer graphene/h-BN interfaces show the formation of a non-abrupt boundary consisting of a mixed phase of boron, nitrogen, as well as carbon. FIG. 2(c) shows UHV nano-ABS line scans for boron ($B_{KLL}$ (171.6 eV)), carbon ($C_{KLL}$ (260.6 eV)), and nitrogen ($N_{KLL}$ (380.0 eV)) Auger lines, along the line marked in FIG. 2(a). Points in the $C_{KLL}$ line scan, representing exponential-decay fits to the data, show the asymmetry in the composition profiles near the interface between monolayer graphene and h-BN, with half widths of 0.09 μm in the slow h-BN growth direction and 0.34 μm in the fast h-BN growth direction. Accordingly, the composition profile from the monolayer graphene domains into the surrounding h-BN is asymmetric. Accounting for the convolution with a finite-sized probe volume, this suggests an abrupt interface boundary between graphene and h-BN neither exists in the slow h-BN growth direction nor in the fast h-BN growth direction, but that the alloy zone with mixed B—C—N composition exhibits a broader tail in the fast h-BN growth direction.

With reference to FIG. 3, UHV STM images were used to investigate the atomic-scale structure of the monolayer graphene/h-BN interface. These images also suggest that a substitutional B—N—C alloy exists at the graphene/h-BN interface. FIG. 3 shows UHV STM images of: (i) monolayer graphene on Ru(0001) substrate; (ii) monolayer h-BN on Ru(0001) substrate; and (iii) monolayer graphene boron nitride heterostructure on Ru(0001) substrate. The monolayer graphene/Ru moiré shown in FIG. 3(b) consists of a 'high' or atop region, centered in one half of the unit cell rhombus, where the C atoms occupy fcc and hcp hollow sites relative to surface Ru atoms, and two distinct 'low' areas with (top, hcp) and (top, fcc) registry, respectively. The h-BN/Ru moiré structure in FIG. 3(d) is made up of majority 'low' regions with (fcc, top) registry, in which N and B atoms are close to the metal, surrounded by narrow, less strongly coupled 'high' areas with registries close to (hcp, fcc) and (top, hcp). For both monolayer graphene and h-BN, zigzag edges are aligned with the boundaries of the moiré unit cell.

Figure 3A:
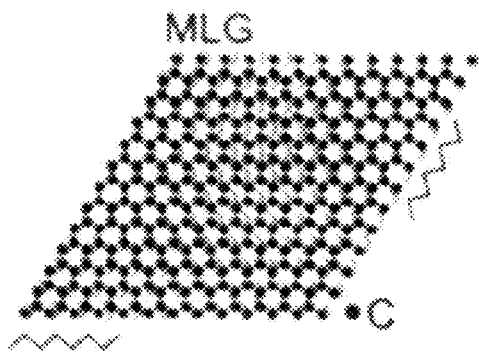
FIG. 3(a) shows a ball and stick model of monolayer graphene on Ru(0001) substrate.
Figure 3B:
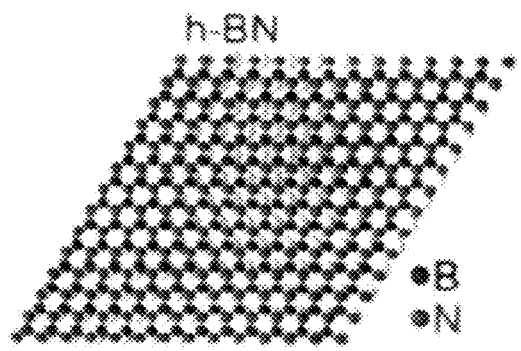
FIG. 3(b) shows a ball and stick model of monolayer hexagonal boron nitride on Ru(0001) substrate.
Figure 3C:
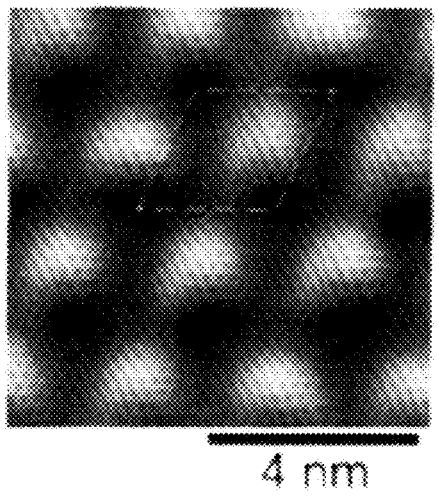
FIG. 3(c) shows a UHV scanning tunneling microscope (STM) image for monolayer graphene on Ru(0001) substrate.
Figure 3D:
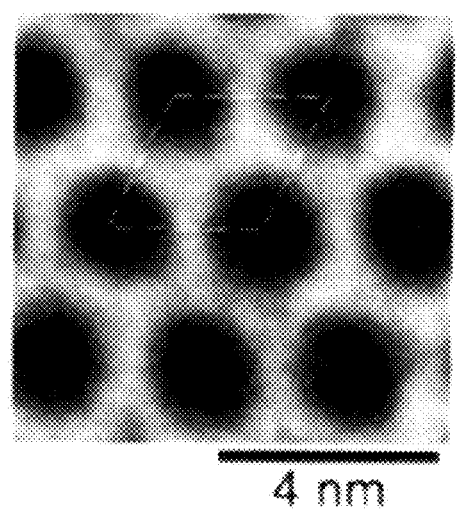
FIG. 3(d) shows a UHV STM image for monolayer hexagonal boron nitride on Ru(0001) substrate.
Figure 3E:
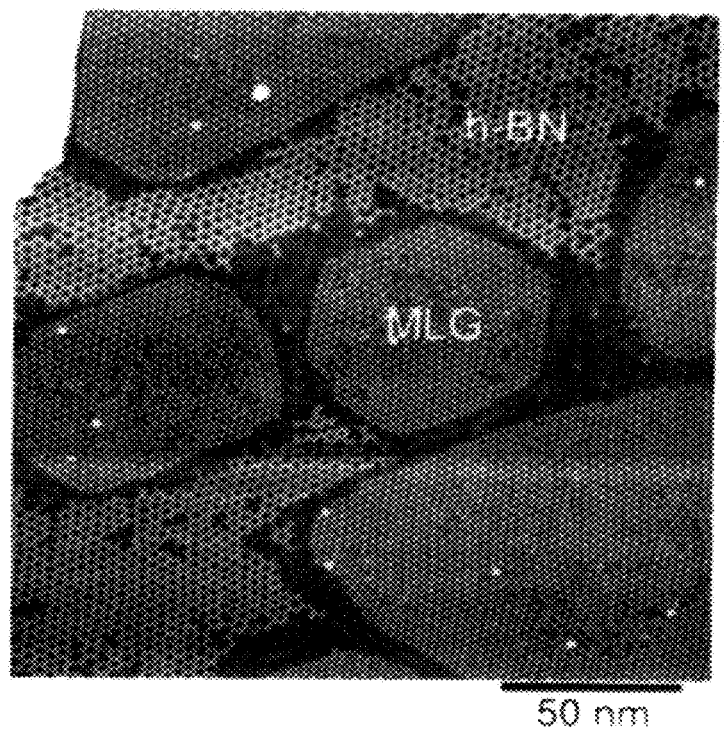
FIG. 3(e) shows a UHV STM image for a graphene-boron nitride heterostructure on Ru(0001) substrate.
Figure 3F:
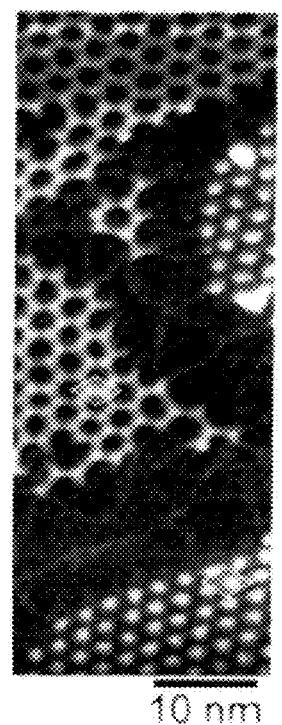
FIG. 3(f) shows a UHV STM image for a graphene-boron nitride heterostructure on Ru(0001) substrate, with magnification of the graphene-boron nitride boundary.

FIG. 3(e) shows an STM image of a graphene-boron nitride heterostructure on Ru(0001). The graphene-boron nitride heterostructure in FIG. 3(e) was prepared via room temperature ethylene adsorption, on epitaxial Ru(0001), followed by dehydrogenation at 800° C., followed by synthesis of boron nitride via exposure to borazine ($10^{-7}$ Torr) at a reduced temperature of 750° C. Coexisting monolayer graphene and h-BN areas are clearly visible. However, in addition to the pure monolayer graphene and h-BN domains, transition regions without the characteristic moiré structures depicted in FIGS. 3(b) and (d) exist near the interfaces. Indeed, FIG. 3(f) shows higher magnification of the monolayer graphene/h-BN boundary. The moiré structures of monolayer graphene and h-BN are closely aligned in-plane, consistent with micro-LEED. However, the moirés of the two pure materials never come atomically close. Rather, as shown, they are separated by an interfacial band (here up to ~20 nm wide) that resembles neither of the moiré structures of pure monolayer graphene or h-BN domains depicted in FIG. 3(b) or (d), consistent with the formation of a mixed (or alloyed) ternary C—B—N phase in an extended region near the interface.

Figure 4A:
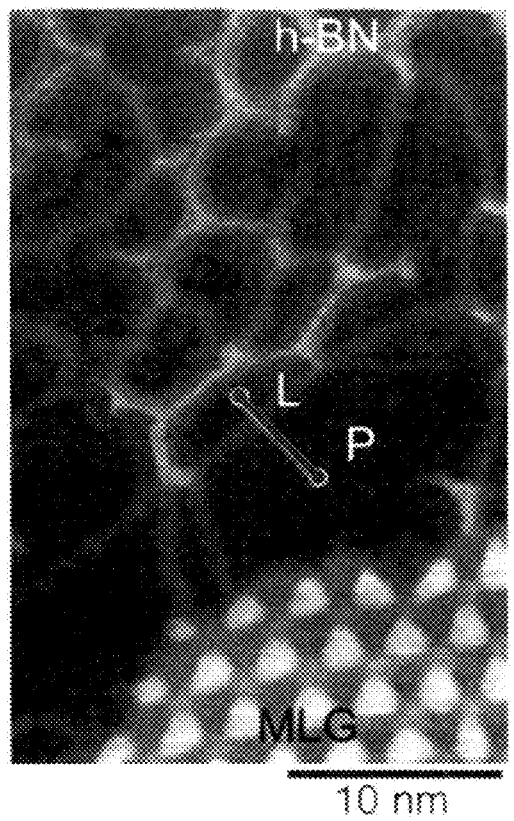
FIG. 4(a) shows a high-resolution cryogenic STM image of the interface between graphene and hexagonal boron nitride within a monolayer graphene boron nitride hetero structure.
Figure 4B:
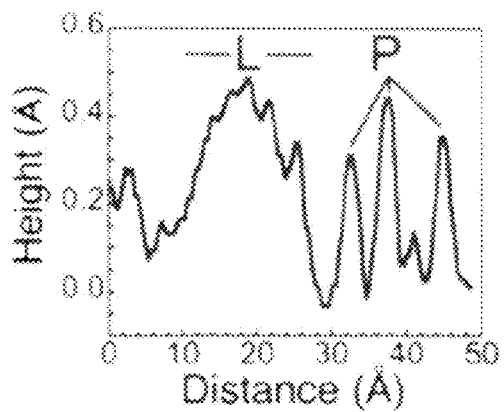
FIG. 4(b) depicts a height profile along a line segment depicted in the high-resolution cryogenic STM image shown in FIG. 4(a).
Figure 4C:
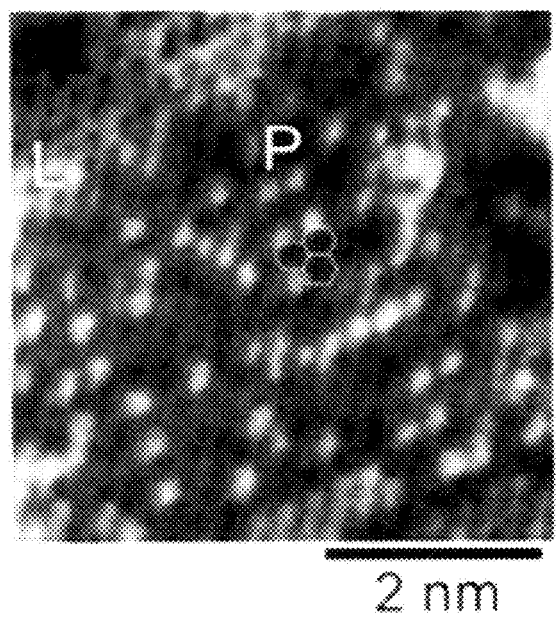
FIG. 4(c) shows another high-resolution cryogenic STM image of the interface between graphene and hexagonal boron nitride within a monolayer graphene boron nitride hetero structure.

High-resolution cryogenic STM images of the monolayer graphene/h-BN interfacial region also suggest the monolayer graphene/h-BN interfacial regions consist of a substitutional B—N—C alloy. FIG. 4 depicts high-resolution cryogenic STM near the graphene-boron nitride interface. FIG. 4(a) shows an overview image, showing monolayer graphene and h-BN domains (as marked), which are separated by a flat interfacial zone with faint lines (L) and atomic-scale point-like protrusions (P). FIG. 4(b) shows a height profile along the line segment shown in FIG. 4(a). This profile shows heights close to h-BN domains in the "low" regions and embedded higher moiré fragments. FIG. 4(c) shows a high-magnification image of the flat near-interface zone, showing a honeycomb structure matching the h-BN atomic lattice, and point-like protrusions. (Imaging parameters: $V_s$=+2.0 V; I=1.0 nA)

Accordingly, observed in connection with the STM images depicted in FIG. 4, the monolayer graphene/h-BN region mostly resembles h-BN characteristics. The observed height is close to the h-BN 'low' regions with embedded higher moiré fragments. The graphene moiré structure terminates in an atomically sharp edge (see FIG. 4(a), identified by marker "MLG"), but a well-developed h-BN moiré appears only several nm away from this boundary. A network of shallow lines (L) and embedded point-like protrusions (P) are imaged with apparent heights of about 0.4 Angstroms (in FIGS. 4(a) and (b)). The protrusions coexist with a clearly resolved honeycomb lattice, and occur isolated or bunched into larger groups with local ordering (see FIG. 4(c)). Their size is comparable to a single graphene or h-BN honeycomb unit (FWHM ~3 Angstroms) and their appearance is similar to substitutional dopants in graphene. (See Zhao, L.; He, R.; Rim, K. T.; Schiros, T.; Kim, K. S.; Zhou, H.; Gutierrez, C.; Chockalingam, S. P.; Arguello, C. J.; Palova, L.; Nordlund, D.; Hybertsen, M. S.; Reichman, D. R.; Heinz, T. F.; Kim, P.; Pinczuk, A.; Flynn, G. W.; Pasupathy, A. N. *Science* 2011, 333, (6045), 999-1003, incorporated by reference in its entirety.)

Therefore, the foregoing STM observations are consistent with a substitutional B—C—N phase near the monolayer graphene/h-BN interface. Existing studies are consistent with this finding. Pairwise incorporation of C in nearest-neighbor B/N sites has been found in atomic-scale holes in free-standing h-BN membranes, (see Krivanek, O. L.; Chisholm, M. F.; Nicolosi, V.; Pennycook, T. J.; Corbin, G. J.; Dellby, N.; Muffin, M. F.; Own, C. S.; Szilagyi, Z. S.; Oxley, M. P.; Pantelides, S. T.; Pennycook, S. J. *Nature* 2010, 464, (7288), 571-574, incorporated by reference in its entirety), and a similar mechanism may lead to C incorporation into the edges of supported h-BN. Indeed, AES composition profiles (see FIG. 2(c)) show similar widths of the transition region for C and (B, N), suggesting that C can substitute for both B and N in the growing h-BN film.

Accordingly, an examination of FIGS. 2-4, suggests that a substitutional B—C—N phase occurs near the graphene/h-BN interfacial regions. The cause of the observed intermixing at the monolayer graphene/h-BN interface is likely the incorporation of C from the Ru surface into the growing h-BN film. A direct exchange of C atoms at the graphene edge with B or N during borazine exposure is another possible cause. However, direct exchange is not expected to explain the wide intermixed zones that have been observed. Direct exchange of monolayer graphene edge C atoms with B or N would be expected to be limited to the immediate vicinity of the interface where there is a high probability of C—B/N swaps. In addition, substitutional B/N doping of graphene during borazine exposure, against which there is evidence from AES and atomic-resolution STM, is also not a likely cause of wide intermixing.

The source of the carbon that incorporates into the h-BN film on a Ru substrate, and thereby leads to intermixing at the monolayer graphene/h-BN interface, is likely thermal C adatoms on the Ru(0001) surface in equilibrium with graphene. (See Loginova, E.; Bartelt, N. C.; Feibelman, P. J.; McCarty, K. F. *New Journal of Physics* 2008, 10, 093026, incorporated by reference in its entirety.) Interstitial C is an alternate possible source, but unlikely, (See Sutter, P. W.; Flege, J.-I.; Sutter, E. A. *Nat Mater* 2008, 7, (5), 406-411, incorporated by reference in its entirety.)) since experiments on bulk crystals and epitaxial Ru(0001) films with negligible C solubility, (such as described in Sutter, P.; Ciobanu, C. V.; Sutter, E. *Small* 2012, n/a-n/a, incorporated by reference in its entirety) show identical results. These findings are consistent with C adatoms on the Ru surface as the predominant C source that results in intermixing at the monolayer graphene/h-BN interfaces.

At sufficiently high temperatures, a population of C adatoms exist on a Ru substrate surface in the presence of graphene. These provide an ample C supply for substitutional incorporation into h-BN during h-BN growth. (See Loginova, E.; Bartelt, N. C.; Feibelman, P. J.; McCarty, K. F. *New Journal of Physics* 2008, 10, 093026, incorporated by reference in its entirety). This is shown in FIG. 5, which depicts thermal C adatoms in equilibrium with graphene on Ru(0001). FIG. 5(*a*) depicts a schematic representation of a graphene domain on a Ru(0001) surface, in equilibrium with C monomers bound in threefold hollow sites of the Ru surface mesh. The strong binding of C atoms on Ru(0001) causes a sizable C monomer population on Ru(0001) in equilibrium with graphene at high temperatures.

Therefore, given ample supply of C adatoms on the Ru surface in the presence of graphene at appropriately high temperatures, existing methods for forming monolayer graphene boron nitride heterostructures on Ru substrates cannot form atomically sharp interfaces between graphene and h-BN domains. One way to narrow the substitutional B—C—N phase near the graphene/h-BN interface is to lower the h-BN growth temperature (as seen in FIG. 3(*e*), where ethylene exposure occurred at 800° C. followed by borazine exposure at 750° C.). However, even if the B—C—N phase region is narrowed, this is insufficient to form monolayer graphene boron nitride heterostructures with atomically-sharp interfaces. Instead, atomically-sharp graphene/h-BN interfaces within synthesized monolayer graphene boron nitride heterostructures can be formed, in one embodiment, via elimination of the population of C adatoms on the Ru substrate surface.

EXEMPLARY EMBODIMENT

In view of the above-described problems, needs and goals, a method according to some embodiments of the disclosed invention will be described in detail. This method comprises one for fabricating monolayer graphene boron nitride heterostructures in a single atomically thin membrane that limits intermixing at boundaries between graphene and h-BN, so as to achieve atomically sharp interfaces between these materials.

Formation of monolayer graphene boron nitride heterostructures preferably occurs on a ruthenium substrate. In one embodiment, the ruthenium substrate comprises a Ru(0001) single crystal substrate. Ru single crystal surfaces can be prepared by the standard method known to those of ordinary skill in the art. This preparation involves, in one embodiment, several cycles of oxygen absorption and flashing to temperatures of 1400° C. Alternately, another preferable substrate consists of an epitaxial Ru(0001) thin film on a sapphire substrate. In one embodiment, epitaxial Ru films are grown by magnetron sputtering on c-axis oriented sapphire substrates, as disclosed in Sutter, P. W.; Albrecht, P. M.; Sutter, E. A. *Appl. Phys. Lett.* 2010, 97, (21), 213101, and incorporated by reference in its entirety.

To initiate growth of monolayer graphene domains, the Ru substrate is initially exposed to ethylene. Preferably, ethylene exposure is performed via UHV chemical vapor deposition. In one embodiment, the Ru substrate is exposed to ethylene at a pressure of approximately $1 \times 10^{-8}$ Torr and a temperature of approximately 740-750° C. In one embodiment, the ethylene consists of high-purity ethylene (99.999%).

As a result of the exposure to ethylene, monolayer graphene domains begin to form on the Ru substrate. Eventually, the Ru substrate is partially covered with monolayer graphene domains. At this point, exposure of ethylene to the Ru(0001) substrate is stopped. In one embodiment, without intending to limit the scope of the claims, ethylene exposure is stopped at approximately 400 seconds (see FIG. 5(*b*)). This is the approximate time under pressure of approximately $1 \times 10^{-8}$ Torr and a temperature of approximately 740-750° C. In alternate embodiments, ethylene exposure is stopped at other times suitable to achieve different partial graphene coverages of the Ru substrate.

The Ru substrate, which is partially covered with monolayer graphene domains, is next subjected to $O_2$ exposure. Preferably $O_2$ exposure is performed in a UHV environment. In one embodiment, the sample is exposed to $O_2$ at a pressure of approximately $2 \times 10^{-9}$ Torr, and a temperature of approximately 610° C., but in alternate embodiments, the temperature can range from 500° C. to 750° C. In one embodiment, the $O_2$ consists of research grade $O_2$ (99.9999%).

During the process of ethylene and $O_2$ exposure, both the C adatom concentration on the Ru surface and the size of the graphene domains are monitored. This is shown in FIG. 5(*b*). The initial ethylene exposure rapidly builds up a population of C monomers. Graphene nucleation and growth draws from this C reservoir, but C adatoms remain on the Ru surface even after stopping the ethylene supply. Low-pressure $O_2$ exposure gradually lowers the C concentration while leaving the area of the monolayer graphene domains nearly unchanged. The graphene etch rate only increases after the C adatom density has saturated at near-zero, that is a level equivalent to clean Ru. By controlling the temperature and $O_2$ dose, graphene domains surrounded by Ru with very low C monomer concentration, comparable to carefully cleaned Ru(0001) without graphene, can be achieved. Thus, exposure to oxygen is stopped when C adatoms have been substantially eliminated from portions of the ruthenium substrate that are not covered by graphene. Substantial elimination is detected, in at least one embodiment, when the C adatom density has saturated at a level that is approximately equivalent to clean Ru.

FIG. 5 shows controlled removal of C monomers from an Ru(0001) substrate near monolayer graphene domains, according to one embodiment. Graphene was initially grown on the Ru(0001) substrate via ethylene exposure at approximately $10^{-8}$ Torr and approximately 750° C. Upon partial coverage of the Ru(0001) substrate with graphene growth, ethylene exposure was stopped. Following that, the Ru substrate, partially covered with graphene, was exposed to $O_2$ at $2\times10^{-9}$ Torr and 610° C.

Figure 6A:
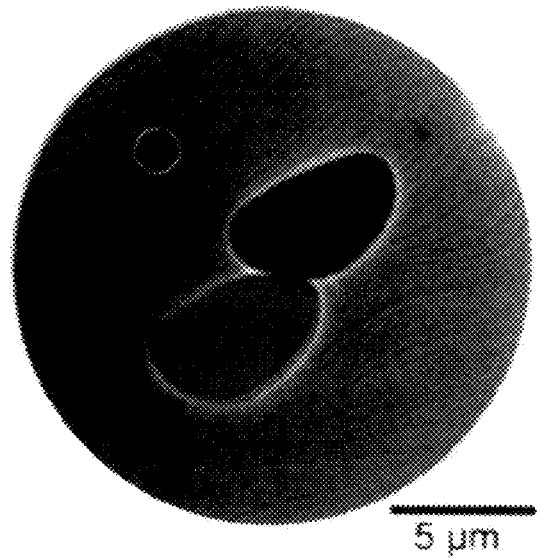
FIG. 6(a) shows a LEEM image of a section of Ru(0001) substrate surface adjacent to two monolayer graphene domains.
Figure 6B:
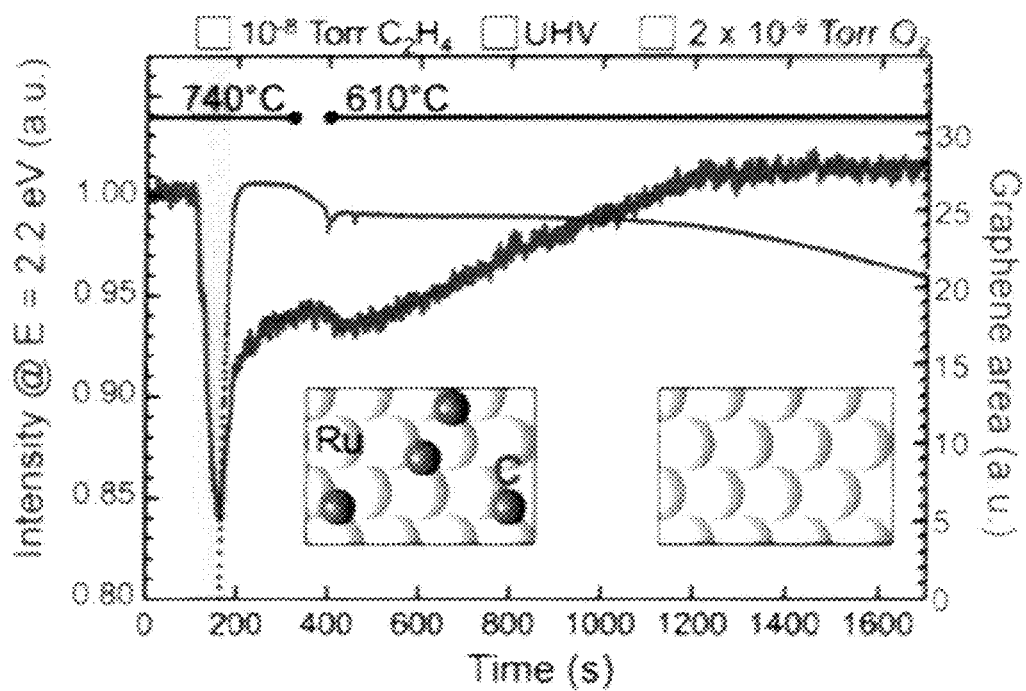
FIG. 6(b) shows a comparison of the evolution of LEEM I-V intensities at V=2.2. eV and the measured area of one of the graphene domains depicted in FIG. 6(a) during processing by exposure to oxygen.

FIG. 6(a) shows a LEEM image of a section of Ru(0001) surface adjacent to two monolayer graphene domains. FIG. 6(b) depicts simultaneous measurement of the LEEM I-V intensity at V=2.2 eV (within the circle in FIG. 6(a)), and of the area of the lower graphene domain in FIG. 5(a). Lower intensity corresponds to higher C adatom concentration. Accordingly, the progressive increase in intensity, which is depicted in FIG. 6(b), indicates the removal of C adatoms until saturation is reached at the level of clean Ru(0001). The area of the graphene domains remain nearly constant until the C adatoms are completely removed from the metal.

Figure 7A:
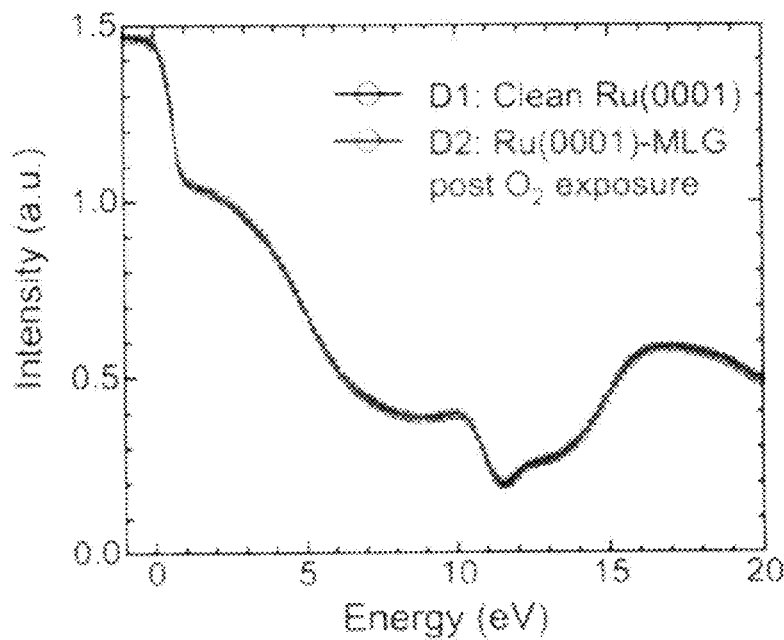
FIG. 7(a) shows a comparison of LEEM I-V curves for clean Ru(0001) substrate surface and Ru(0001) substrate with partial graphene coverage after C monomer removal via $O_2$ exposure.
Figure 7B:
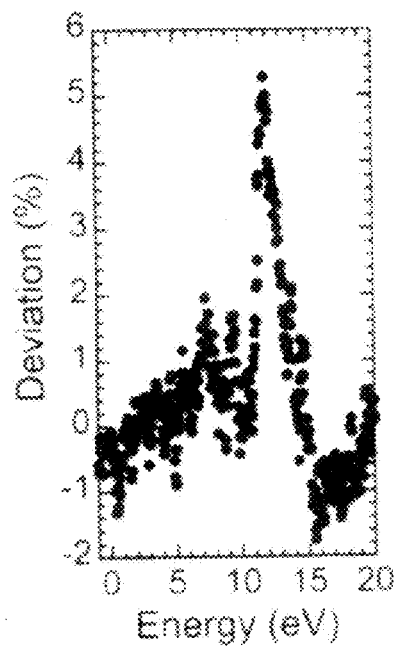
FIG. 7(b) shows a deviation between two data sets, D1 and D2, shown in FIG. 7(a).

Accordingly, appropriate temperature control during the $O_2$ dose can yield graphene domains surrounded by Ru with very low C monomer concentration. This is shown in FIG. 7. FIG. 7 illustrates a comparison of meticulously cleaned Ru(0001) where the Ru(0001) consists of monolayer graphene domains following the elimination of C adatoms via $O_2$ exposure. FIG. 7(a) shows LEEM I-V curves for a clean Ru(0001) surface without graphene as well as for a Ru(0001) surface with partial graphene coverage, for which C monomers on the metal have been selectively removed by $O_2$ exposure ($2\times10^{-9}$ Torr, 610° C.). The two I-V curves were measured under identical conditions. For the comparison, the data were normalized to the same intensity at the lowest electron energy, E=−1 eV. Symbols represent a subset (every 3rd point) of the experimental data. FIG. 7(b) depicts the deviation between the two data sets D1 and D2 shown in FIG. 7(a), expressed as (D1−D2)/D1 (in percent). The difference between the I-V characteristics is smaller than ±1.5% for all electron energies except near the minimum at E~12 eV. In particular, the difference at E~2 eV, which is proportional to the density of C adatoms, is <1%. Hence, the data sets D1 and D2 are virtually indistinguishable, demonstrating the efficient C removal from the metal surface by low-pressure $O_2$ exposure, despite the presence of graphene domains.

The elimination of C adatoms from the Ru substrate, based on exposure to $O_2$, can be monitored by monitoring the diminishing LEEM I-V intensity of the Ru substrate surface with grown monolayer graphene domains until it substantially and approximately equals the intensity of a clean Ru substrate surface. This is shown in FIG. 5(b)-(c). FIG. 5(b) shows a LEEM image of clean Ru(0001), and FIG. 5(c) shows a LEEM image of the Ru surface following the nucleation of monolayer graphene domains. FIG. 5(d) depicts LEEM I-V spectra obtained at T=700° C. on a clean Ru(0001) (black circle in FIG. 5(b)) as well as on the Ru surface adjacent to graphene domains (circle in FIG. 5(c)). These spectra show the characteristic reduction of the reflected intensity when V approximately equals 2 eV. The intensity reduction is proportional to the coverage of C monomers on the Ru surface. Accordingly, monitoring the reduction in intensity can be used to track the corresponding elimination of C adatoms from the Ru substrate.

Figure 8:
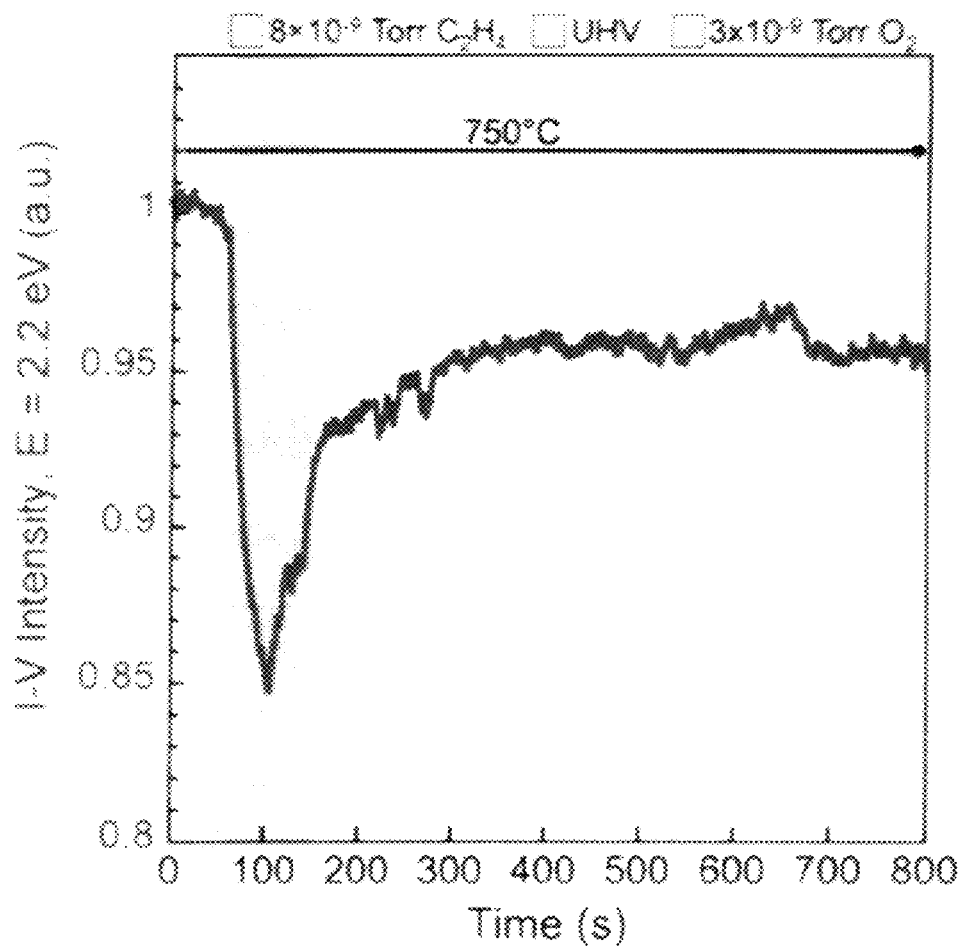
FIG. 8 shows time-dependent LEEM I-V intensity at 2.2 eV electron energy during growth of monolayer graphene and $O_2$ exposure at 750° C.

Sufficient elimination of C monomers from the Ru surface is conditioned upon appropriately controlled temperatures during $O_2$ exposure. At temperatures that are too high (approximately 750° C. or above), $O_2$ initially removes some C monomers, but their high equilibrium concentration is rapidly restored after terminating the $O_2$ dose. This is shown in FIG. 8, which depicts oxygen-induced removal of thermal C adatoms on Ru(0001) via a time-dependent LEEM I-V intensity at 2.2 eV electron energy during graphene growth and $O_2$ exposure at 750° C. Low-pressure $O_2$ exposure of the Ru surface with partial graphene coverage leads to removal of some C from the surface (increase in intensity between ~575 s to 665 s), but as shown in the figure, the higher equilibrium C concentration is rapidly restored upon termination of the $O_2$ dose.

Upon sufficient removal of C monomers from the Ru substrate by exposure to $O_2$ at lower temperature, the growth of boron nitride is initiated. This is preferably performed via ultrahigh-vacuum (UHV) chemical vapor deposition by exposure of the metal surface to borazine. In one embodiment, the Ru substrate is exposed to borazine at a pressure of approximately $1\times10^{-7}$ Torr and a temperature of approximately 680° C. In one embodiment, borazine consists of research grade (99.9999%) borazine. Exposure of the sample to borazine initiates growth of hexagonal boron nitride (h-BN).

STM images showing the monolayer/h-BN boundaries at various magnifications following formation according to a disclosed embodiment is shown in FIGS. 10(a)-(c). These figures display a morphology that is strikingly different from that in FIGS. 3 and 4. While the preferential attachment of h-BN to monolayer graphene is maintained, interfacial regions without moiré structure are now completely absent, i.e., the monolayer graphene and h-BN moirés are joined together by an atomically sharp boundary (see e.g., FIG. 10(a)). This is underscored by high-resolution imaging of a linear interface (FIG. 10b)-(d)), which shows an example of the atomic-scale bonding of the two materials in a zigzag boundary without any discernible intermediate structure. This implies that graphene and h-BN are atomically bonded together, without forming any intermixed or alloyed ternary C—B—N phases.

Figure 9A:
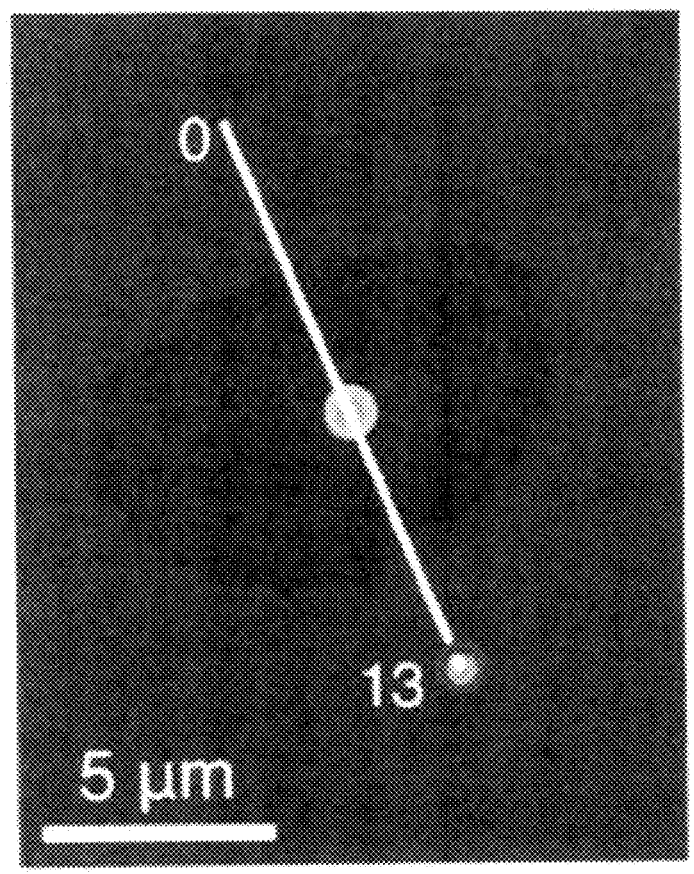
FIG. 9(a) shows a UHV SEM image of monolayer graphene hexagonal boron nitride heterostructure grown with an oxygen etching step to remove carbon adatoms from Ru(0001).
Figure 9B:
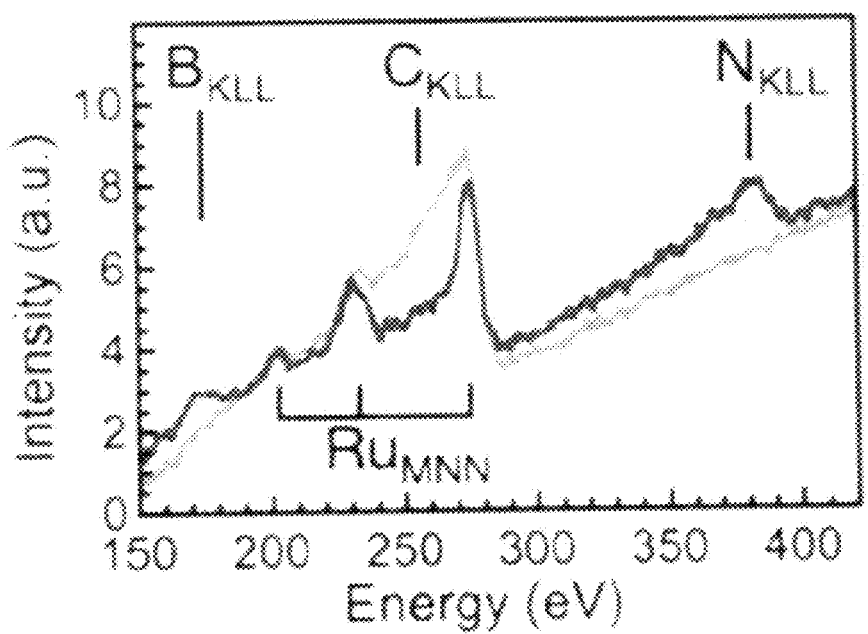
FIG. 9(b) shows Auger electron spectra of the monolayer graphene hexagonal boron nitride heterostructure depicted in FIG. 9(a).
Figure 9C:
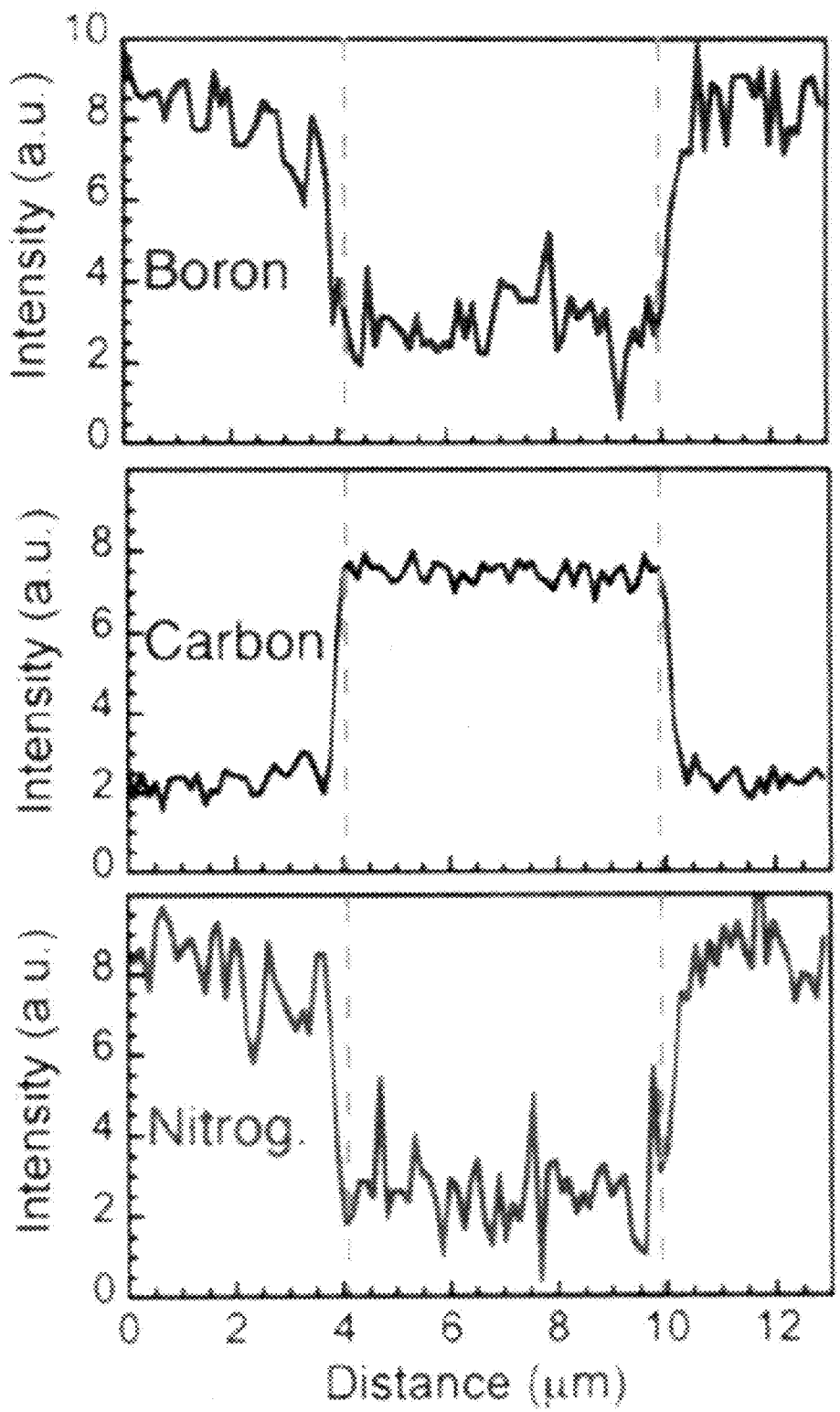
FIG. 9(c) shows UHV nano-AES line scans measuring the local abundance of boron, carbon and nitrogen for the monolayer graphene hexagonal boron nitride heterostructure depicted in FIG. 9(a).

Further, the impact on the monolayer graphene/h-BN boundaries due to C elimination by low-pressure $O_2$ exposure was assessed by nano-AES, and at the atomic scale by cryogenic STM. This is shown in FIG. 9. Samples were prepared in accordance with one of the disclosed embodiments; i.e., (i) partial monolayer graphene growth at $10^{-8}$ Torr, 780° C.; (ii) $O_2$ exposure for elimination of C adatoms at $2\times10^{-9}$ Torr, 680° C.; (iii) followed by h-BN growth via borazine exposure at $10^{-8}$ Torr, 680° C. FIG. 9(a) depicts a UHV SEM image of the monolayer graphene domain embedded in a continuous h-BN layer. FIG. 9(b) depicts Auger electron spectra at points near the center of the monolayer graphene domain and in the h-BN layer, marked in FIG. 9(a). FIG. 9(c) depicts nano-AES line scans for $B_{KLL}$ (171.6 eV), $C_{KLL}$ (260.6 eV), and $N_{KLL}$ (380.0 eV) Auger lines, along the line marked in FIG. 9(a). Notably, the AES line scans in FIG. 9(c) show abrupt composition changes for carbon, boron, and nitrogen across the monolayer graphene/h-BN interface.

The disclosed results demonstrate that mixed B—N—C phases, consisting of h-BN doped with C, form spontaneously during sequential graphene and boron nitride growth on Ru. This finding not heretofore known or understood, exemplified by the STM images of FIG. 3 and nano-AES line scans of FIG. 9 demonstrates that C—B—N ternary alloy phases of arbitrary composition between pure graphene and pure BN can be synthesized on Ru and possibly other transition metal substrates. The primary cause for the formation of an intermixed, non-abrupt boundary between graphene and h-BN in a 2D heterostructure is the incorporation of C adatoms from the Ru surface into the growing h-BN domains. Undoped h-BN forms only after this C reservoir is eliminated. Based on these findings, some of the embodiments disclosed herein are directed to a method for forming monolayer graphene boron nitride heterostructures with atomically sharp interfaces as described in Sutter, P., et al., Nano Lett., 12 (9), pp. 4869-4874 (2012), incorporated herein by reference in its entirety. Other embodiments aim at purposely synthesizing desired C—B—N alloys with controlled composition by simultaneous or sequential exposure to appropriate precursor gases, such as ethylene and borazine. These disclosed methods create possible applications that exploit sharp interfaces between graphene and h-BN within monolayer graphene boron nitride heterostructures or homogeneous ternary C—B—N alloy phases. One possibility includes processes that control the synthesis of B—N—C 'alloys' having a tunable composition on transition metals. Another possibility is the exploitation of the synthesis on metals to achieve non-equilibrium structures that are unstable (or metastable) in isolated 2D materials, such as a uniform 2D membrane. Another possibility includes exploiting the 1D equivalent of the more familiar 2D interfaces in thin film hetero structures, for example effects of lattice mismatch, the formation and stability of polar and non-polar interfaces, etc. Another possibility can be applied to terminate the edges of nano-graphene, such as quantum dots or atomically controlled ribbons via their embedding in a monolayer h-BN membrane, thus providing avenues for facilitating the handling of wafer-scale arrays of graphene nanostructures by inserting them into insulating BN, and setting the stage for realizing the fascinating properties predicted for graphene-boron nitride junctions in monolayer sheets.

It will be appreciated by persons skilled in the art that the present invention is not limited to what has been particularly shown and described hereinabove. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. That alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent.

The invention claimed is:

1. A method for forming a graphene boron nitride interface, comprising:
    exposing a ruthenium substrate to ethylene;
    exposing the ruthenium substrate to oxygen after exposure to ethylene;
    stopping exposure to oxygen when C adatoms have been substantially eliminated from portions of the ruthenium substrate that are not covered by monolayer graphene domains; and
    exposing the ruthenium substrate to borazine after exposure to oxygen.

2. The method according to claim 1, further comprising:
    stopping exposure to ethylene upon partial coverage of the ruthenium substrate with monolayer graphene domains.

3. The method according to claim 1, wherein exposing the ruthenium substrate to ethylene further comprises:
    exposure to ethylene under $10^{-8}$ Torr and 800° C. and stopping exposure to ethylene exposure after approximately 400 seconds.

4. The method according to claim 1, wherein the exposures to ethylene and borazine exposure are performed via ultra-high vacuum chemical vapor deposition.

5. The method according to claim 1, wherein the ruthenium substrate comprises a Ru(0001) single crystal substrate.

6. The method according to claim 1, wherein the ruthenium substrate comprises an epitaxial Ru(0001) thin film on a sapphire substrate.

7. The method according to claim 1, wherein the exposure to ethylene occurs at a pressure of $1 \times 10^{-8}$ Torr.

8. The method according to claim 1, wherein the exposure to ethylene occurs at a temperature between 740° C. to 800° C.

9. The method according to claim 1, wherein the exposure to oxygen occurs at a pressure of $2 \times 10^{-9}$ Torr.

10. The method according to claim 1, wherein the exposure to oxygen occurs at a temperature between 610° C. to 680° C.

11. The method according to claim 1, wherein the exposure to borazine occurs at a pressure of $1 \times 10^{-7}$ Torr.

12. The method according to claim 1, wherein the step of exposure to borazine occurs at a temperature of 680° C.

13. The method according to claim 1, wherein the ethylene is 99.999 percent pure.

14. The method according to claim 1, wherein the borazine is 99.999 percent pure.

15. The method according to claim 1, wherein the oxygen ($O_2$) is 99.999 percent pure $O_2$.

16. The method according to claim 1, wherein after exposing the ruthenium substrate to borazine the ruthenium substrate is covered by a graphene-boron nitride heterostructure having an abrupt interface between graphene and boron nitride.

17. The method according to claim 1, wherein after exposing the ruthenium substrate to borazine the ruthenium substrate is covered by homogeneous ternary C—B—N alloy phases having a non-abrupt interface between graphene and boron nitride.

18. A method for synthesizing tunable homogeneous ternary C—B—N alloy phases, comprising:
    exposing a ruthenium substrate to ethylene sufficient to form the homogeneous ternary C—B—N alloy phases;
    exposing the ruthenium substrate to oxygen after exposure to ethylene;
    exposing the ruthenium substrate to borazine after exposure to oxygen sufficient to form the homogeneous ternary C—B—N alloy phases, wherein the homogeneous ternary C—B—N alloy phases are formed as a uniform 2D membrane.

19. The method according to claim 18, wherein the homogeneous ternary C—B—N alloy phases are formed at the interface between boron nitride and graphene.

* * * * *